United States Patent
Park

(10) Patent No.: US 7,629,254 B2
(45) Date of Patent: Dec. 8, 2009

(54) SEMICONDUCTOR DEVICE

(75) Inventor: Jin-Ha Park, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 132 days.

(21) Appl. No.: 11/849,687

(22) Filed: Sep. 4, 2007

(65) Prior Publication Data

US 2008/0135950 A1 Jun. 12, 2008

(30) Foreign Application Priority Data

Dec. 11, 2006 (KR) .................. 10-2006-0125293

(51) Int. Cl.
*H01L 21/44* (2006.01)
*H01L 23/48* (2006.01)
(52) U.S. Cl. .................. 438/655; 438/682; 438/683; 257/754; 257/768; 257/E21.438
(58) Field of Classification Search .................. 438/630, 438/649, 651, 655, 682, 683, 684, 685; 257/754, 257/768, 769, 770, E21.438
See application file for complete search history.

(56) References Cited

U.S. PATENT DOCUMENTS 5,103,272 A * 4/1992 Nishiyama .................. 257/388
6,013,569 A * 1/2000 Lur et al. .................. 438/595
6,541,328 B2 * 4/2003 Whang et al. .............. 438/231
6,987,062 B2 * 1/2006 Iizuka et al. ................ 438/682
2003/0183881 A1* 10/2003 Lee et al. .................. 257/382
2006/0094176 A1* 5/2006 Fehlhaber et al. .......... 438/197
2007/0152284 A1* 7/2007 Park .......................... 257/413

FOREIGN PATENT DOCUMENTS

KR         100233557 B1      9/1999
KR      1020050071786 A      7/2005

* cited by examiner

*Primary Examiner*—Kevin M Picardat
(74) *Attorney, Agent, or Firm*—Sherr & Vaughn, PLLC

(57) ABSTRACT

Embodiments relater to a semiconductor device and a method of fabricating the same. A source/drain area may be formed by using the spacer having the dual structure of the oxide layer and nitride layer. After etching a part of the oxide layer, the salicide layer may be formed on the gate electrode and the source/drain area, and the spacer may be removed. The contact area may be ensured, so a higher degree of integration may be achieved.

15 Claims, 4 Drawing Sheets

SEMICONDUCTOR DEVICE

Figure 1:
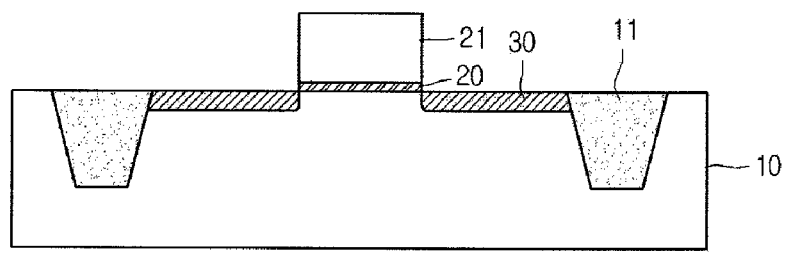

The present application claims priority under 35 U.S.C. 119 and 35 U.S.C. 365 to Korean Patent Application No. 10-2006-0125293 (filed on Dec. 11, 2006), which is hereby incorporated by reference in its entirety.

BACKGROUND

As semiconductor devices have become more highly integrated, a line width and an interval of patterns constituting the semiconductor device may be narrowed. In accordance with the reduction in the line width of the pattern (that is, the design rule), the channel length of the transistor may be reduced.

To reduce a size of a semiconductor device while increasing the response speed thereof, a method of reducing the gate length has been used. As the gate length is reduced, the channel length, which may be a moving distance of a carrier, may also be reduced. A response speed and a level of integration of the semiconductor device may thus be improved.

Further, a method of reducing the Gate to Contact space has been suggested and may improve the level of integration of the semiconductor device.

The spacer that influences the gate and the contact area may be used to prevent a HCI (hot carrier injection) effect and a short channel effect and may reduce the resistance when forming the source/drain area. That is, the spacer may serve as a mask when the impurity implantation process is performed to form the source/drain area.

However, if the lower area of the space is enlarged when the spacer is formed in the gate, the contact may make contact with the spacer. This may change characteristics of the transistor.

SUMMARY

Embodiments relate to a semiconductor device and a method of fabricating the same.

Embodiments relate to a semiconductor device and a method of fabricating the same, in which a spacer is removed to ensure the contact area, which may improve a level of integration of the semiconductor device.

According to embodiments, a semiconductor device may include a semiconductor substrate having an isolation layer, a gate insulating layer and a gate electrode stacked on the semiconductor substrate, an LDD area formed at a lower portion of the semiconductor substrate and a source/drain area adjacent to the LDD area, a first salicide layer formed on the gate electrode, a second salicide layer formed over the LDD area and the source/drain area, an interlayer dielectric layer on the first and second salicide layers, and a contact formed on the interlayer dielectric layer to connect with the second salicide layer.

According to embodiments, a method of fabricating a semiconductor device may include forming a gate insulating layer, a gate electrode and an LDD area on a semiconductor substrate having an isolation layer, forming a spacer having a dual insulating layer structure on the gate electrode, forming a source/drain area by using the spacer as a mask, etching an insulating layer formed at an inner portion of the spacer, thereby exposing lateral sides of the gate electrode and an upper portion of the LDD area which may be adjacent to the insulating layer, forming first and second salicide layers on the gate electrode and the source/drain area, respectively, removing the spacer, forming an interlayer dielectric layer on the salicide layer, and etching the interlayer dielectric layer to form a contact connected to the salicide layer.

DRAWINGS

FIGS. 1 to 10 are sectional drawings illustrating a procedure for fabricating a semiconductor device, according to embodiments.

DESCRIPTION

Figure 10:
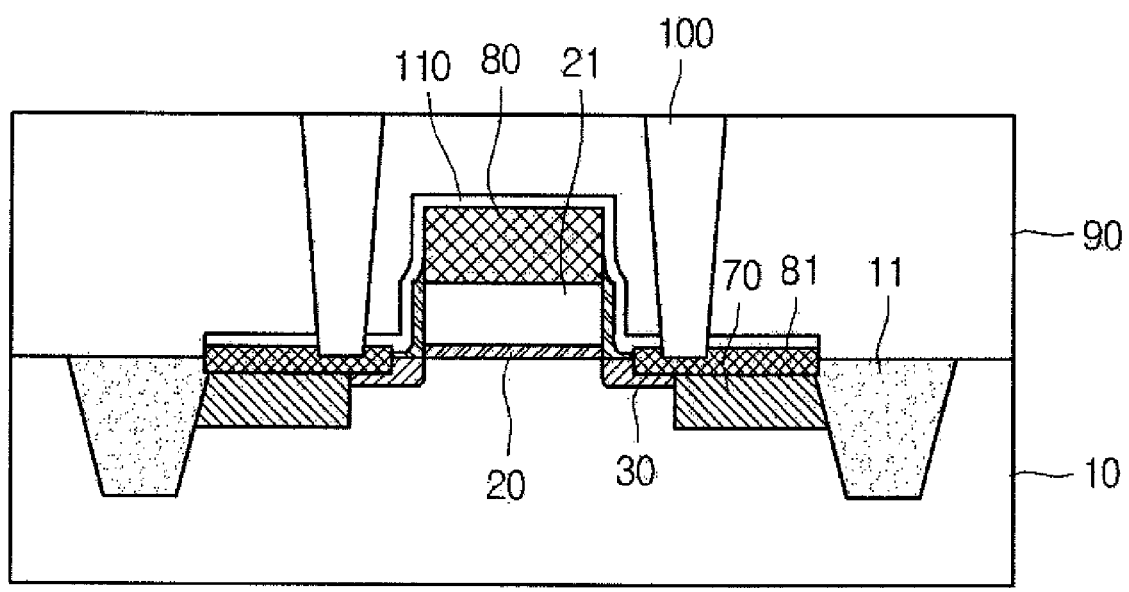

FIG. 10 is a drawing illustrating a semiconductor device according to embodiments.

Referring to FIG. 10, a semiconductor device according to embodiments may include semiconductor substrate 10, isolation layer 11, gate oxide layer 20, and gate electrode 21.

LDD area 30 may be formed on semiconductor substrate 10 at both sides of the gate oxide layer 20 and gate electrode 21.

Source/drain area 70 may be connected to LDD area 30 at an outer portion of LDD area 30.

In embodiments, first salicide layer 80, which may have a relatively large thickness, may be formed on gate electrode 21. Second salicide layer 81 may be formed on source/drain area 70 and a part of LDD area 30.

Interlayer dielectric layer 90 may be formed on semiconductor substrate 10, including first and second salicide layers 80 and 81.

Interlayer dielectric layer 90 may be formed with contact 100 that may make contact with second salicide layer 81 for interconnection work.

According to embodiments, a spacer may be shallowly formed at a side of gate electrode 21.

Accordingly, second salicide layer 81 may be broadly formed over source/drain area 70 and part of LDD area 30. The contact area for forming contact 100 may thus be ensured. In embodiments, contact 100 may be easily formed.

In embodiments, since an interval between contact 100 and gate electrode 21 may be narrow, a degree of integration of the semiconductor device may be improved.

FIGS. 1 to 10 are drawings illustrating a procedure for fabricating a semiconductor device, according to embodiments.

Referring to FIG. 1, isolation layer 11 may be formed on semiconductor substrate 10, and may define an active area of semiconductor substrate 10. For instance, isolation layer 11 may include an STI (Shallow Trench Isolation) area.

Semiconductor substrate 10 may include a single crystalline silicon substrate or a substrate doped with P type impurities or N type impurities.

A transistor may be formed on semiconductor substrate 10.

According to embodiments, after depositing an oxide layer and polysilicon on semiconductor substrate 10, gate oxide layer 20 and gate electrode 21 may be sequentially formed on semiconductor substrate 10 through an etching process.

According to embodiments, gate electrode 21 may include polysilicon, metal or a stack layer of polysilicon and metal. For the purpose of high-integration operation, the polysilicon may be converted into a metal gate.

LDD (Lightly Doped Drain) area 30 may be formed on semiconductor substrate 10 by performing ion implantation using low-density dopants (P type impurities or N type impurities). According to embodiments, gate electrode 21 may serve as a mask.

Figure 2:
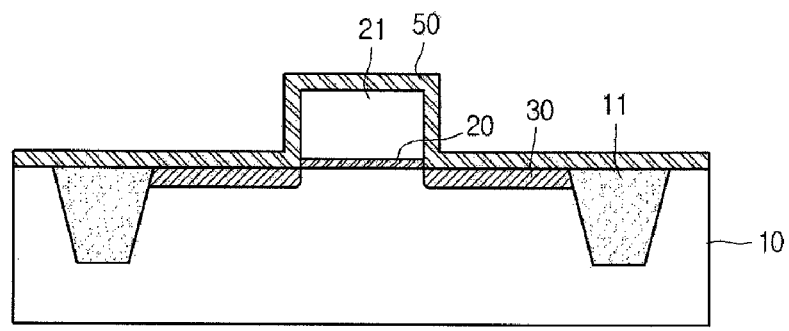

Referring to FIG. 2, an oxide layer 50 that may serve as an insulation layer, may be formed on semiconductor substrate 10 at a thickness of approximately 150 to 300 Å.

Figure 3:
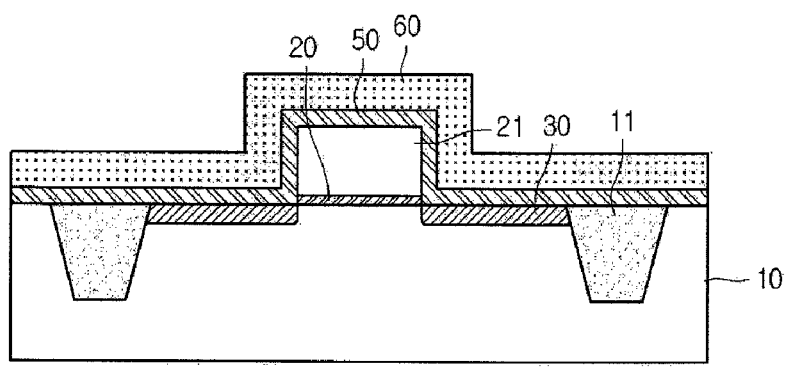

Referring to FIG. 3, nitride layer 60, which may serve as an insulation layer, may be formed on oxide layer 50, and may have a thickness of approximately 300 to 700 Å.

Figure 4:
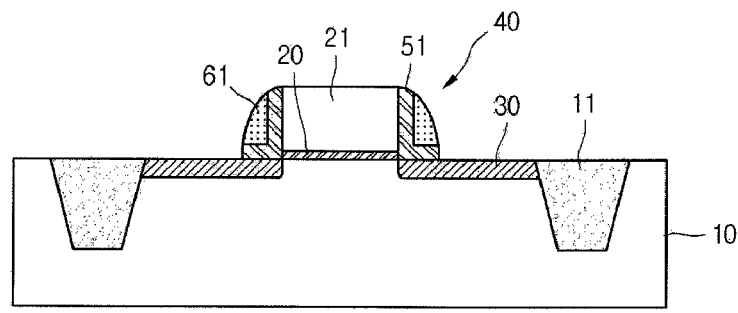

Referring to FIG. 4, nitride layer 60 and oxide layer 50 may be entirely etched, so that spacer 40 making contact with both sidewalls of gate electrode 21 may be formed. Spacer 40 may have a dual structure including oxide layer 51 and nitride layer 61.

Figure 5:
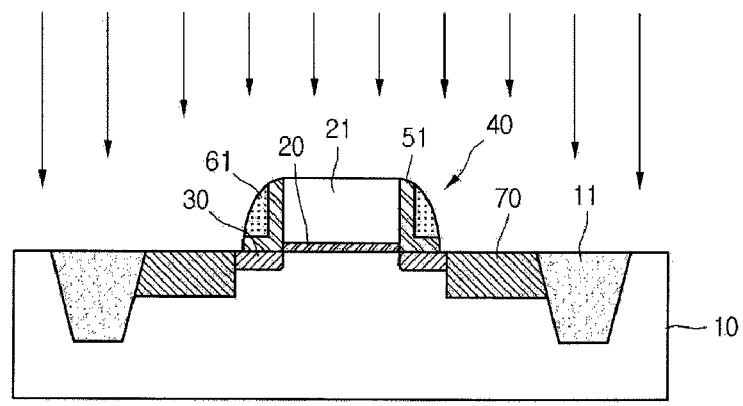
Figure 6:
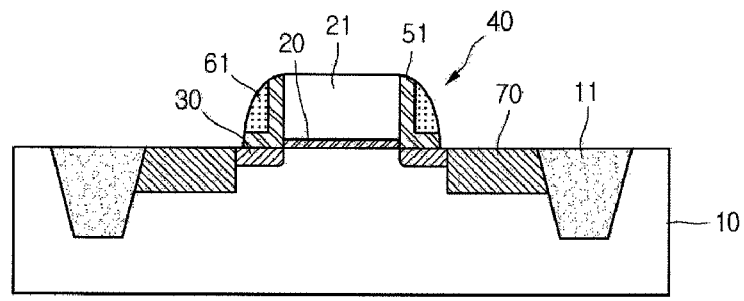

Referring to FIGS. 5 and 6, source/drain area 70 connected to LDD area 30 may be formed by performing high-density dopant ion implantation (N type or P type impurities), and may use gate electrode 21 and spacer 40 as an ion implantation mask. In addition, the heat treatment process may be performed to activate the dopant implanted into source/drain area 70.

According to embodiments, a pre-cleaning process may be performed relative to the region where salicide will be formed and may remove the residue oxide layer. A salicide process may then be performed.

Figure 7:
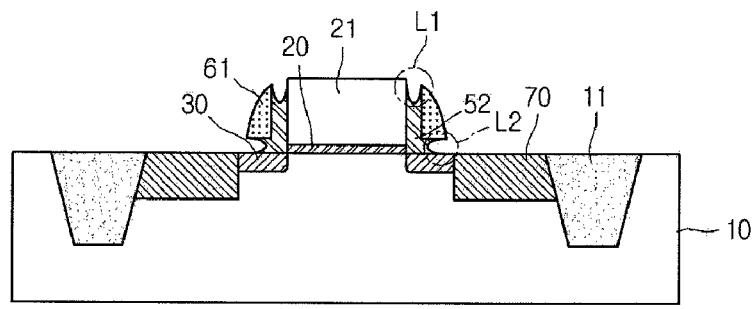

Referring to FIG. 7, the primary wet etching process may be performed with respect to the outer region of oxide layer 51.

Thus, a first portion of oxide layer 51 that may contact gate electrode 21 may be recessed, so that first loss area L1 may be formed. In addition, a second portion of oxide layer 51 that may contact LDD area 30 may be recessed so that second loss area L2 may be formed. Thus, oxide layer pattern 52 may be formed.

According to embodiments, due to first and second loss areas L1 and L2, the lateral sides of gate electrode 21 may be exposed corresponding to first and second loss areas L1 and L2. Accordingly, when salicide layer 80 may be formed on gate electrode 21, a polysilicon area that forms gate electrode 21 may be reduced and salicide layer 80 formed on the gate area may be enlarged.

Figure 8:
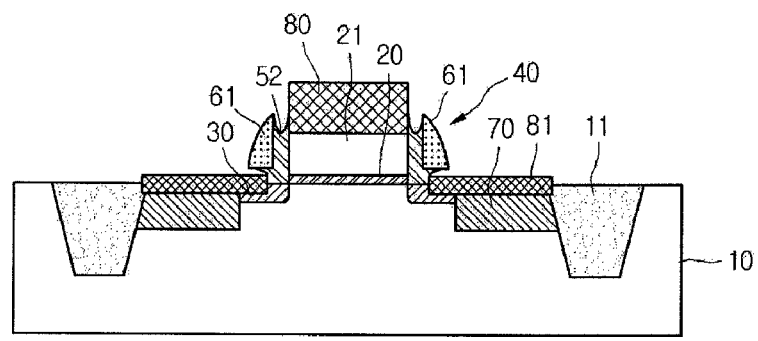

Referring to FIG. 8, first and second salicide layers 80 and 81 may be formed on gate electrode 21 and source/drain area 70. For instance, first and second salicide layers 80 and 81 may be obtained by depositing a metal layer including cobalt or nickel and then performing primary and secondary heat treatment processes with respect to the metal layer.

According to embodiments, first salicide layer 80 may be formed on gate electrode 21 and second salicide layer 81 may be formed on source/drain area 70.

Since the lateral sides of gate electrode 21 may be exposed corresponding to the depth of first loss area L1 of oxide layer pattern 52 formed through the primary wet etching process, first salicide layer 80 formed on gate electrode 21 may have a relatively large thickness.

In embodiments, since predetermined portions of LDD area 30 may be exposed due to second loss area L2 of oxide layer pattern 52, second salicide layer 81 may be formed over the predetermined portions of LDD area 30 in source/drain area 70.

Figure 9:
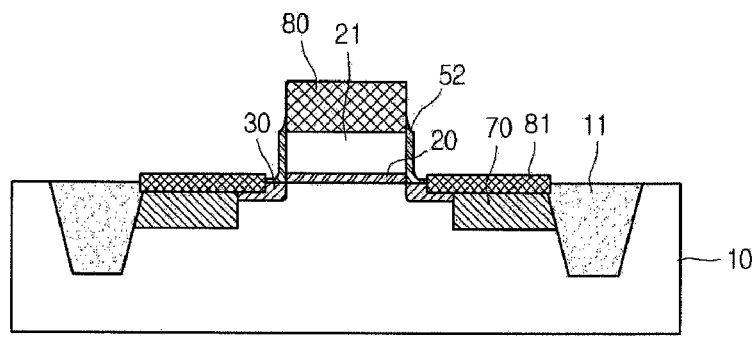

Referring to FIG. 9, the secondary wet etching process may be performed to remove nitride layer 61 that forms spacer 40, which may serve as an ion implantation mask when source/drain area 70 may be formed.

According to embodiments, some of oxide layer pattern 52 formed on the sidewall of gate electrode 21 may be also removed. However, oxide layer pattern 52 may not be completely removed, so oxide layer pattern 52 may protect gate electrode 21 and LDD area 30.

Referring to FIG. 10, etch stop layer 110 and interlayer dielectric layer 90 may be formed on semiconductor substrate 10 having source/drain area 70, gate electrode 21 and first and second salicide layers 80 and 81.

Etch stop layer 110 may prevent first and second salicide layers 80 and 81 from being etched when the contact hole is formed. In embodiments, etch stop layer 110 may include a nitride (SiN) layer.

In embodiments, interlayer dielectric layer 90 may be formed by depositing and planarizing PMD (Pre Metal Dielectric) or ILD (Interlayer Dielectric) using one of PSG (Phosphorus Silicate Glass), BPSG (Boron-Phosphorus Silicate Glass) and PE-TEOS.

A photoresist layer may be coated on interlayer dielectric layer 90 and may provide an interconnection and the contact hole may be formed through the photolithography process. After that, a metal, such as tungsten (W), may be filled in the contact hole, thereby forming a contact 100.

Since first and second salicide layers 80, 81 may be formed on the gate area and source/drain area 70 after through the primary wet etching process and spacer 40 may be removed through the secondary wet etching process, contact 100 may be readily formed without making contact with other components due to an expansion part of second salicide layer 81 formed on source/drain area 70. In embodiments, a distance between contact 100 and gate electrode 21 may be reduced, so that the degree of integration of the semiconductor device may be improved.

According to embodiments, the source/drain area may be formed by using the spacer that serves as an ion implantation mask to form a high-density impurity area, and then the spacer may be removed through the etching process, so that the contact area may be ensured when forming the contact.

In embodiments, since the distance between the contact and the gate may be reduced, the integration degree of the semiconductor device may be improved.

Further, the spacer may have the dual structure including the oxide layer and the nitride layer, so the salicide layer, which may be formed by using the oxide layer pattern formed through the primary etching process, may have thick thickness. Thus, the characteristics of the semiconductor device may be improved.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method, comprising:
   forming a gate insulating layer, a gate electrode, and an LDD area over a semiconductor substrate having an isolation layer;
   forming a spacer having a dual insulating layer structure over the gate electrode forming a source/drain area using the spacer as a mask;
   etching an insulating layer formed at an inner portion of the spacer to expose lateral sides of the gate electrode and an upper portion of the LDD area adjacent to the insulating layer;
   forming first and second salicide layers over the gate electrode and the source/drain area, respectively;
   removing at least a portion of the spacer;
   forming an interlayer dielectric layer over the salicide layers; and
   etching the interlayer dielectric layer to form a contact connected to the second salicide layer.

2. The method of claim 1, wherein the spacer comprises a stacked structure of an oxide layer and a nitride layer.

3. The method of claim 1, wherein an outer portion of the oxide layer formed at the inner portion of the spacer is wet-etched, so that an upper portion of the lateral side of the gate electrode and an upper outer portion of the LDD area, which are adjacent to the oxide layer, are exposed.

4. The method of claim 3, wherein the first salicide layer formed on the gate electrode extends to the upper portion of the lateral side of the gate electrode, which is exposed as the oxide layer is etched.

5. The method of claim 3, wherein the second salicide layer formed on the source/drain area extends to the upper outer portion of the LDD area, which is exposed as the oxide layer is etched.

6. The method of claim 1, wherein removing at least a portion of the spacer comprises performing a wet etching process.

7. The method of claim 2, wherein the oxide layer has a thickness of 150 Å to 300 Å and the nitride layer has a thickness of 300 Å to 700 Å.

8. The method of claim 1, wherein each of the first and second salicide layers comprise at least one of cobalt and nickel.

9. A device comprising:
   a semiconductor substrate having an isolation layer;
   a gate insulating layer and a gate electrode stacked over the semiconductor substrate;
   a lightly doped drain (LDD) area formed at a lower portion of the semiconductor substrate and a source/drain area adjacent to the LDD area;
   a first salicide layer over the gate electrode
   a second salicide layer over at least a portion of the LDD area and the source/drain area;
   an interlayer dielectric layer over the first and second salicide layers; and
   a contact formed in the interlayer dielectric layer and connected with the second salicide layer; and
   a spacer formed between sides of the gate insulating layer and gate electrode and the second salicide layer, wherein
   the spacer is removed after forming the first and second salicide layers.

10. The device of claim 9, wherein each of the first and second salicide layers comprise at least one of cobalt and nickel.

11. The device of claim 9, wherein the second salicide layer extends from an edge of the spacer to the isolation layer.

12. A device comprising:
   a gate insulating layer and a gate electrode over a semiconductor substrate;
   a lightly doped drain (LDD) region formed adjacent to the gate insulating layer and the gate electrode in the semiconductor substrate;
   a source/drain region formed adjacent to the LDD region in the semiconductor substrate;
   a salicide layer formed over at least a portion of the LDD region and over the source/drain and
   a spacer formed between a side of the gate insulating layer and gate electrode and the salicide layer, wherein
   the spacer is removed after forming the first and second salicide layers.

13. The device of claim 12, further comprising:
   an interlayer dielectric layer over the salicide layer; and
   a contact formed in the interlayer dielectric layer and electrically coupled to the salicide layer.

14. The device of claim 13, further comprising a top salicide layer formed over the gate electrode, wherein the interlayer dielectric layer is formed over the top salicide layer.

15. The device of claim 12, wherein the salicide layer comprises at least one of cobalt or nickel.

* * * * *